United States Patent
Park et al.

(10) Patent No.: US 10,020,057 B2
(45) Date of Patent: Jul. 10, 2018

(54) SEMICONDUCTOR MEMORY DEVICE AND OPERATING METHOD THEREOF WITH A CONNECTION CONTROL TRANSISTOR OPERATION VOLTAGE ADJUSTED

(71) Applicant: SK hynix Inc., Gyeonggi-do (KR)

(72) Inventors: Jong Kyung Park, Gyeonggi-do (KR); Ji Hyun Seo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/250,841

(22) Filed: Aug. 29, 2016

(65) Prior Publication Data

US 2017/0287560 A1    Oct. 5, 2017

(30) Foreign Application Priority Data

Mar. 29, 2016  (KR) .......................... 10-2016-0037530

(51) Int. Cl.
| | |
|---|---|
| *G11C 16/10* | (2006.01) |
| *G11C 16/04* | (2006.01) |
| *G11C 16/34* | (2006.01) |

(52) U.S. Cl.
CPC .......... *G11C 16/10* (2013.01); *G11C 16/0483* (2013.01); *G11C 16/3427* (2013.01)

(58) Field of Classification Search
None
See application file for complete search history.

(56) References Cited

U.S. PATENT DOCUMENTS

| | | | | |
|---|---|---|---|---|
| 6,295,227 B1* | 9/2001 | Sakui | ........................ | G11C 8/14 |
| | | | | 257/E27.103 |
| 6,850,439 B1* | 2/2005 | Tanaka | .................... | G11C 16/16 |
| | | | | 365/185.11 |
| 2007/0047314 A1* | 3/2007 | Goda | .................. | G11C 16/0483 |
| | | | | 365/185.18 |
| 2007/0165473 A1* | 7/2007 | Suzuki | .................... | G11C 7/065 |
| | | | | 365/207 |
| 2011/0188307 A1* | 8/2011 | Kito | ........................ | G11C 16/04 |
| | | | | 365/185.02 |
| 2012/0008400 A1* | 1/2012 | Fukuzumi | .......... | G11C 16/0483 |
| | | | | 365/185.18 |
| 2012/0099379 A1* | 4/2012 | Chu | .................. | H01L 27/11556 |
| | | | | 365/185.21 |
| 2012/0320697 A1* | 12/2012 | Nagadomi | ............... | G11C 7/18 |
| | | | | 365/218 |

(Continued)

FOREIGN PATENT DOCUMENTS

| | | |
|---|---|---|
| KR | 1020150063848 | 6/2015 |
| KR | 1020150093019 | 8/2015 |

*Primary Examiner* — J. H. Hur
(74) *Attorney, Agent, or Firm* — IP & T Group LLP

(57) ABSTRACT

There is provided a semiconductor memory device and an operating method thereof. A semiconductor memory device includes a memory cell array including a plurality of pages; a peripheral circuit suitable for performing a program operation by applying a program voltage, a pass voltage, and a pipe transistor operation voltage, to the memory cell array; and a control logic suitable for controlling the peripheral circuit to perform the program operation, wherein the control logic adjusts a potential level of the pipe transistor operation voltage according to an address of a selected page among the plurality of pages.

20 Claims, 6 Drawing Sheets

(56) References Cited

U.S. PATENT DOCUMENTS

2014/0085982 A1\* 3/2014 Asaoka .................. G11C 16/06
                                                    365/185.17
2015/0221389 A1\* 8/2015 Kim .................. G11C 16/3445
                                                    365/185.17

\* cited by examiner

SEMICONDUCTOR MEMORY DEVICE AND OPERATING METHOD THEREOF WITH A CONNECTION CONTROL TRANSISTOR OPERATION VOLTAGE ADJUSTED

CROSS-REFERENCE TO RELATED APPLICATION

The present application claims priority to Korean patent Application No. 10-2016-0037530, filed on Mar. 29, 2016, which is incorporated herein by reference in its entirety.

BACKGROUND

1. Field

An aspect of the present disclosure relates to an electronic device, and more particularly, to a semiconductor memory device and an operating method thereof.

2. Description of the Related Art

Semiconductor devices, particularly, semiconductor memory devices are generally classified into volatile memory devices and nonvolatile memory devices.

A non-volatile memory device performs a read/write operation at a relatively low speed, but retains stored data even when a power supply is cut off. Accordingly, the non-volatile memory device is used to store data to be retained regardless of a power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

The flash memories have an advantage of a RAM in which data is freely programmed and erased, and an advantage of the ROM in which stored data is retained even when a power supply is cut off. The flash memories are widely used as a storage medium of portable electronic devices such as a digital camera, a personal digital assistant (PDA), and an MP3 player.

The flash memory may be classified into two-dimensional semiconductor device having a string horizontally formed on a semiconductor substrate and a three-dimensional semiconductor device having a string vertically formed on a semiconductor substrate.

The three-dimensional semiconductor device is a memory device devised to overcome the limit of the degree of integration in two-dimensional semiconductor devices and includes a plurality of strings vertically formed on a semiconductor substrate. The memory strings include a drain select transistor, memory cells, and a source select transistor, which are coupled in series between a bit line and a source line.

SUMMARY

Embodiments provide a semiconductor memory device and an operating method thereof, which can prevent a program disturbance during a program operation of the semiconductor memory device.

According to an aspect of the present disclosure, there is provided a semiconductor memory device including: a memory cell array including a plurality of pages; a peripheral circuit suitable for performing a program operation by applying a program voltage, a pass voltage, and a pipe transistor operation voltage, to the memory cell array; and a control logic suitable for controlling the peripheral circuit to perform the program operation, wherein the control logic adjusts a potential level of the pipe transistor operation voltage according to an address of a selected page among the plurality of pages.

According to an aspect of the present disclosure, there is provided a semiconductor memory device including: a plurality of strings including a plurality of memory cells coupled in series between a bit line and source line; a peripheral circuit suitable for performing a program operation by applying, to the plurality of strings, a program voltage, a pass voltage, and a pipe transistor; and a control logic suitable for controlling the peripheral circuit to perform the program operation, wherein the control logic adjusts a potential level of the pipe transistor operation voltage according to a program order of a selected memory cell among the plurality of memory cells.

According to an aspect of the present disclosure, there is provided a method of operating a semiconductor memory device comprising a plurality of strings including a plurality of drain-side memory cells, a pipe transistor, and a plurality of source-side memory cells, which are coupled in series between a bit line and a source line, the method including: setting a potential level of a pipe transistor operation voltage according to positions of selected memory cells to which a program voltage is applied among the plurality of drain-side memory cells and the plurality of source-side memory cells; applying the set pipe transistor operation voltage to the piper transistor; and performing a program operation to the selected memory cells by applying the program voltage to the selected memory cells and applying a pass voltage to the other memory cells.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless stated otherwise.

Figure 1:
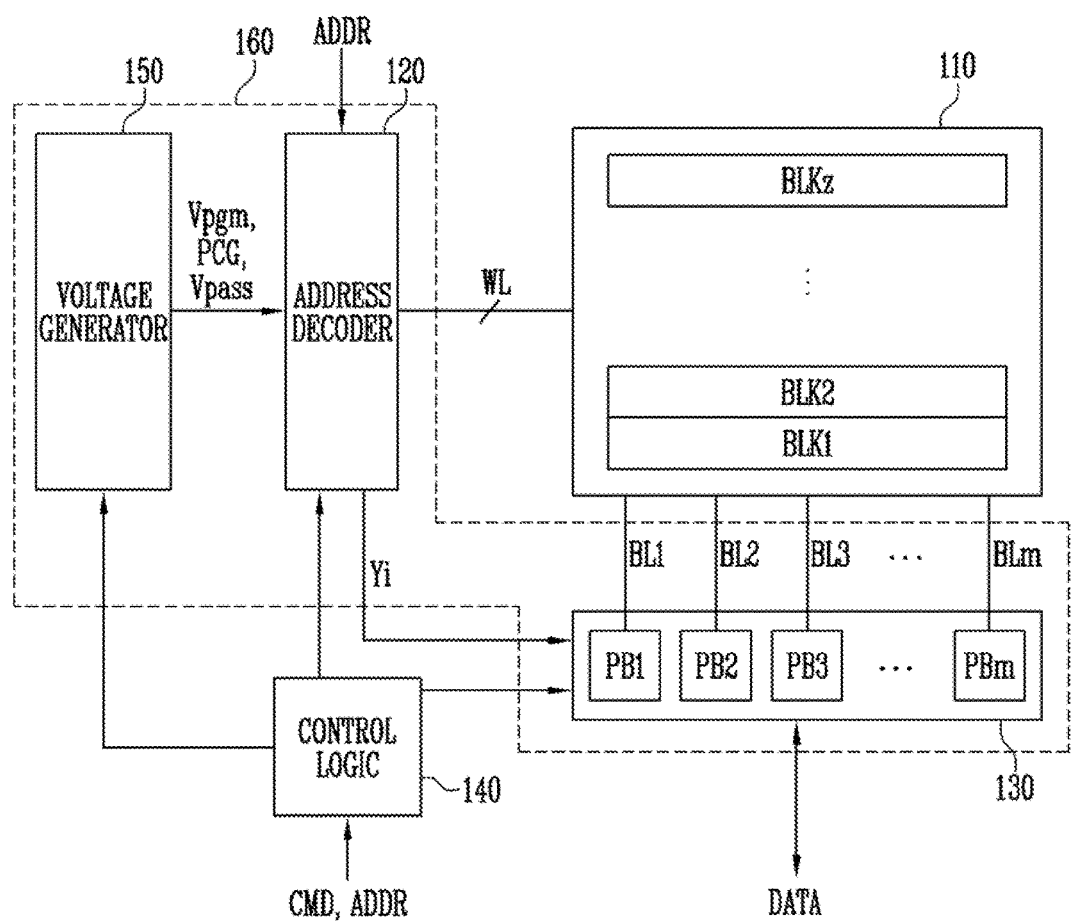
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150. The address decoder 120, the read/write circuit 130, and the voltage generator 150 may be defined as a peripheral circuit 160 for performing a program operation of the memory cell array 110.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130. Each of the plurality of memory blocks BLK1 to BLKz includes a plurality of memory cells. As an embodiment, the plurality of memory cells may be nonvolatile memory cells. More specifically, the plurality of memory cells may be charge trap device-based nonvolatile memory cells. A plurality of memory cells commonly coupled to one word line may be defined as one page. Therefore, the memory cell array 110 may be configured to include a plurality of pages.

In addition, each of the plurality of memory blocks BLK1 to BLKz in the memory cell array 110 includes a plurality of strings. Each of the plurality of strings includes a drain select transistor, a plurality of drain-side memory cells, a pipe transistor, a plurality of source-side memory cells, and a source select transistor, which are coupled in series between a bit line and a source line.

The address decoder 120 is coupled to the memory cell array 110 through the word lines WL. The address decoder 120 is configured to operate in response to control of the control logic. The address decoder 120 receives an address ADDR through an input/output buffer (not shown) inside the semiconductor memory device 100.

The address decoder 120 decodes a row address in the received address ADDR in a program voltage applying operation, and applies a program voltage Vpgm and a pass voltage, which are generated from the voltage generator 150, to a plurality of word lines WL according to the decoded row address. Also, the address decoder 120 applies a pipe transistor operation voltage PCG generated from the voltage generator 150 to a pipe gate line of the memory cell array 110.

The program operation of the semiconductor memory device 100 is performed in units of pages of the memory cell array 110. In this case, the program operation may be performed using a normal program scheme or a reverse program scheme. According to the normal program scheme, pages are sequentially programmed from a first page, in which memory cells adjacent to the source select transistor are included, to the last page, in which memory cells adjacent to the drain select transistor are included. According to the reverse program scheme, pages are sequentially programmed from the last page to the first page. The normal program scheme and the reverse program scheme are contrary to each other in the program order of the pages.

When the program operation is requested, the received address ADDR includes a block address, a row address, and a column address. Here, the row address may be defined as a page address. The address decoder 120 selects one memory block and one word line according to the block address and the row address. The column address Yi is decoded by the address decoder 120 provided to the read/write circuit 130.

The address decoder 120 may include a block decoder, a row decoder, an address buffer, and the like.

The read/write circuit 130 includes a plurality of page buffers PB1 to PBm. The plurality of page buffers PB1 to PBm are coupled to the memory cell array 110 through bit lines BL1 to BLm. The plurality of page buffers PB1 to PBm temporarily store data DATA input in the program operation and respectively control the potential levels of corresponding bit lines BL1 to BLm according to the temporarily stored data. That is, the plurality of page buffers PB1 to PBm apply a program permission voltage for example, 0 V or a program prohibition voltage for example, Vcc to the respective corresponding bit lines BL1 to BLm according to the temporarily stored data. The read/write circuit 130 operates in response to control of the control logic 140.

The control logic 140 is coupled to the address decoder 120, the read/write circuit 130, and the voltage generator 150. The control logic 140 receives a command CMD and an address ADDR through the input/output buffer (not shown) inside the semiconductor memory device 100. The control logic 140 controls the general operations of the semiconductor memory device 100 in response to the command CMD.

The control logic 140 controls the voltage generator 150 such that, in the program operation, the voltage level of the pipe transistor operation voltage PCG is adjusted according to the address ADDR of a selected page among the plurality of pages in the memory cell array 110.

When the program operation is performed according to the normal program scheme in which pages are sequentially programmed from the first page in which memory cells adjacent to the source select transistor are included to the last page in which memory cells adjacent to the drain select transistor are included, the control logic 140 may control the voltage generator 150 to raise a level of the pipe transistor operation voltage PCG as the selected page becomes close to the drain select transistor, and may control the voltage generator 150 to lower the level of the pipe transistor operation voltage PCG as the selected page becomes close to the source select transistor.

In another embodiment, when the memory cells included in the selected page are included in the drain-side memory cells, the control logic 140 may control the voltage generator 150 to set the pipe transistor operation voltage PCG to a first potential level. When the memory cells included in the selected page are included in the source-side memory cells, the control logic 140 may control the voltage generator 150 to set the pipe transistor operation voltage PCG to a second potential level lower than the first potential level.

When the program operation is performed according to the reverse program scheme in which pages are sequentially programmed from the last page in which the memory cells adjacent to the drain select transistor are included to the first page in which the memory cells adjacent to the source select transistor are included, the control logic 140 may control the voltage generator 150 to lower a level of the pipe transistor operation voltage PCG as the selected page becomes close to the drain select transistor, and may control the voltage generator 150 to raise the level of the pipe transistor operation voltage PCG as the selected page becomes close to the source select transistor.

In another embodiment, when the memory cells included in the selected page are included in the source-side memory cells, the control logic 140 may control the voltage generator 150 to set the pipe transistor operation voltage PCG to the first potential level. When the memory cells included in the selected page are included in the drain-side memory cells, the control logic 140 may control the voltage generator 150 to set the pipe transistor operation voltage PCG to the second potential level lower than the first potential level.

The voltage generator 150 generates the program voltage Vpgm, the pass voltage Vpass, and the pipe transistor operation voltage PCG under control of the control logic 140 in the program operation. In this case, the voltage generator 150 may generate the pipe transistor operation voltage PCG by adjusting the potential level of the pipe transistor operation voltage PCG under the control of the control logic 140.

As described above, in the embodiment of the present disclosure, the potential level of the pipe transistor operation voltage PCG can be adjusted on the basis of the address of a selected page according to the normal program scheme or the reverse program scheme. That is, the potential level of the pipe transistor operation voltage PCG can be adjusted according to a program order of the selected page among the plurality of pages included in the memory cell array 110. As the program order of the selected page becomes earlier, the potential level of the pipe transistor operation voltage PCG can be decreased. As the program order of the selected page becomes later, the potential level of the pipe transistor operation voltage PCG can be increased.

Figure 2:
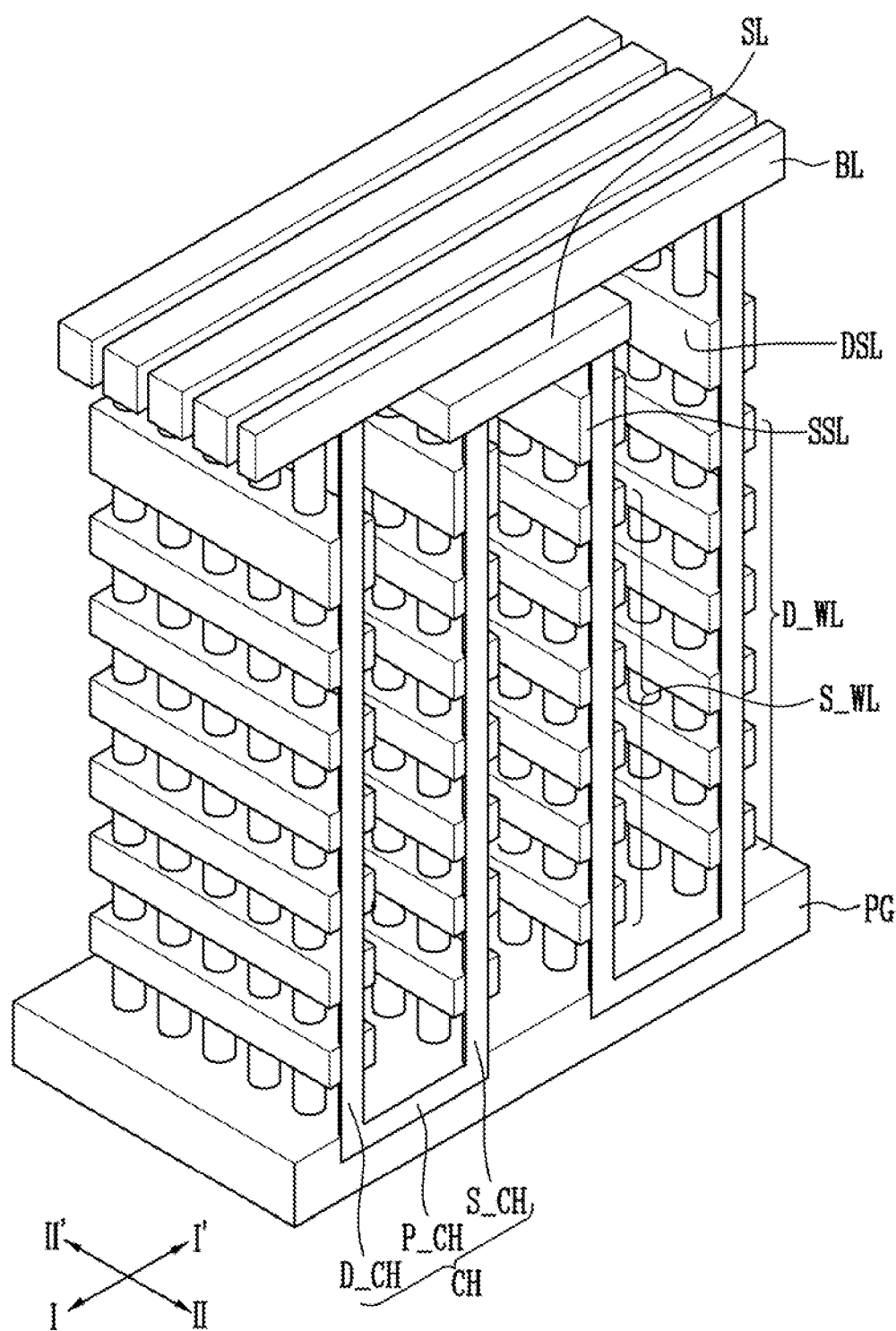
FIG. 2 is a perspective view illustrating a memory cell array of the semiconductor memory device according to the embodiment of the present disclosure.

FIG. 2 is a perspective view illustrating a memory cell array of the semiconductor memory device according to the embodiment of the present disclosure. In FIG. 2, interlayer insulating layers are omitted for convenience of illustration.

As shown in FIG. 2, the memory cell array includes U-shaped channel layers CH arranged in a first direction I-I' and a second direction II-II' intersecting the first direction I-I'. Here, the U-shaped channel layer CH includes a pipe channel layer P_CH formed in a pipe gate PG and a pair of source-side and drain-side channel layers S_CH and D_CH coupled to the pipe channel layer P_CH.

Also, the memory cell array includes source-side word line layers S_WL stacked along the source-side channel layer S_CH over the pipe gate PG, and drain-side word lines D_WL stacked along the drain-side channel layer D_CH over the pipe gate PG. Here, a source select line layer SSL is stacked over the source-side word line layers S_WL, and a drain select line layer DSL is stacked over the drain-side word line layers D_WL. In this case, dummy word line layers (not shown) may be stacked between the drain-side word line layers D_WL and the drain select line layer DSL, and dummy word line layers (not shown) may be stacked between the source-side word line layers S_WL and the source select line layer SSL.

According to the above-described structure, memory cells are stacked along the U-shaped channel layer CH, and drain and source select transistors are provided at both ends of the U-shaped channel layer CH, respectively. The pipe gate PG disposed in a U shape at the lowermost portion of a string is disposed at a middle position of the memory cells to operate as a pipe transistor.

Also, the memory cell array includes bit line layers BL coupled to the drain-side channel layer D_CH to extend in the first direction I-I' and a source line layer SL coupled to the source-side channel layer S_CH to extend in second direction II-II'.

Figure 3:
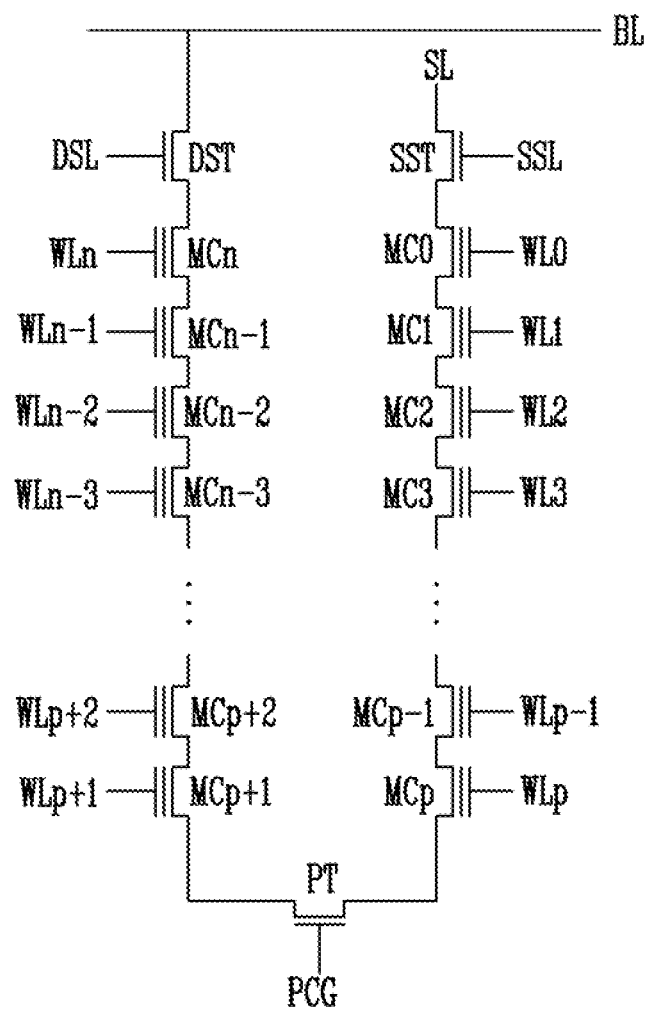
FIG. 3 is a circuit diagram illustrating a string of the semiconductor memory device according to the embodiment of the present disclosure.

FIG. 3 is a circuit diagram illustrating a string of the semiconductor memory device according to the embodiment of the present disclosure.

Referring to FIG. 3, the string includes a drain select transistor DST, a plurality of memory cells MC0 to MCn, a pipe transistor PT, and a source select transistor SST, which are coupled in series between a bit line BL and a source line SL. A plurality of memory cells MCp+1 to MCn disposed between the drain select transistor DST and the pipe transistor PT among the plurality of memory cells MC0 to MCn may be defined as drain-side memory cells, and a plurality of memory cells MC0 to MCp disposed between the source select transistor SST and the pipe transistor PT among the plurality of memory cells MC0 to MCn may be defined as source-side memory cells.

A gate of the drain select transistor DST is coupled to a drain select line DSL, and a gate of the source select transistor SST is coupled to a source select line SSL. Gates of the plurality of memory cells MC0 to MCn are coupled to a plurality of word lines WL0 to WLn, respectively. A gate of the pipe transistor PT is coupled to a pipe transistor gate line such that the pipe transistor operation voltage PCG generated from the voltage generator 150 of FIG. 1 is applied thereto.

Only one string is illustrated in the description of the present disclosure. However, one memory block includes a plurality of strings respectively coupled to a plurality of bit lines, and the plurality of strings may share word lines.

Figure 4:
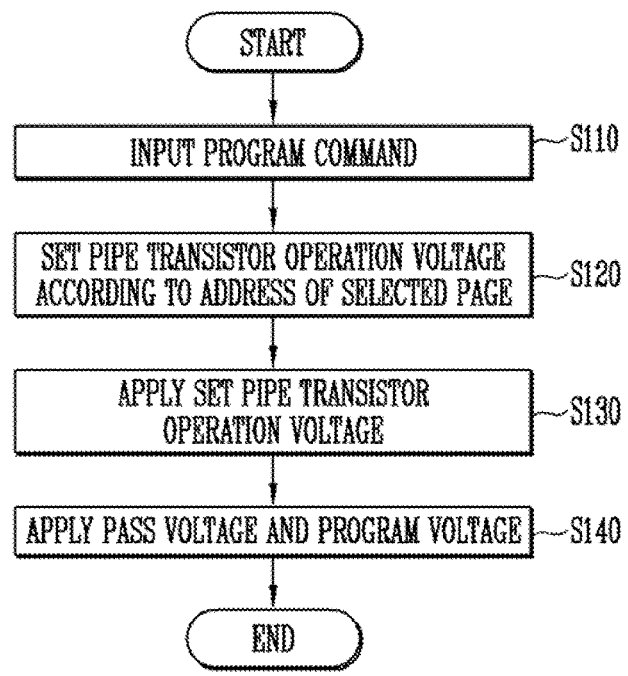
FIG. 4 is a flowchart illustrating an operating method of the semiconductor memory device according to the embodiment of the present disclosure.

FIG. 4 is a flowchart illustrating an operating method of the semiconductor memory device according to the embodiment of the present disclosure.

Figure 5:
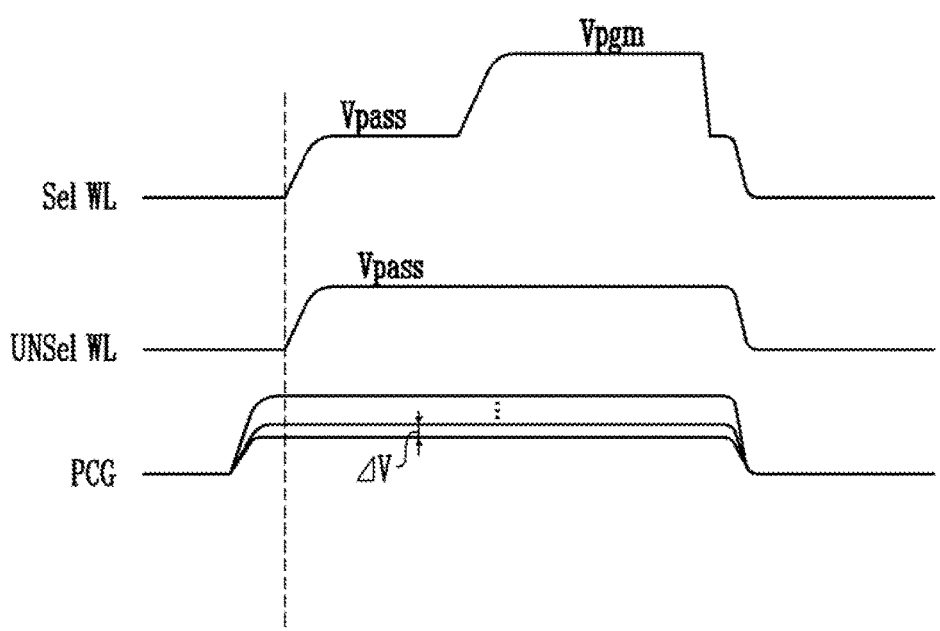
FIG. 5 is a waveform illustrating the operating method of the semiconductor memory device according to the embodiment of the present disclosure.

FIG. 5 is a waveform illustrating the operating method of the semiconductor memory device according to the embodiment of the present disclosure.

A program method of the semiconductor memory device according to the embodiment of the present disclosure will be described as follows with reference to FIGS. 1 to 5.

In the embodiment of the present disclosure, the program method will be described according to the normal program scheme or the reverse program scheme.

Normal Program Scheme

When a command CMD for a program command is input from the outside at step S110, the control logic 140 controls the peripheral circuit 16 to perform the program operation to the semiconductor memory device at steps S120 to S140. At this time, the control logic 140 controls the peripheral circuit 160 to sequentially program pages from the first page, in which memory cells adjacent to the source select transistor are included, to the last page, in which memory cells adjacent to the drain select transistor are included, according to the normal program scheme.

The read/write circuit 130 arbitrarily stores data DATA to be programmed, which is input from the outside.

The plurality of page buffers PB1 to PBm control the potential levels of the bit lines BL1 to BLm according to the temporarily stored data, respectively. That is, the plurality of page buffers PB1 to PBm apply a program permission voltage for example, 0 V or a program prohibition voltage for example, Vcc to the bit lines BL1 to BLm according to the temporarily stored data, respectively.

At step S120, the control logic 140 sets the potential level of the pipe transistor operation voltage PCG according to the address ADDR of a selected page among a plurality of pages included in a selected memory block.

In this case, the control logic 140 may control the voltage generator 150 to raise the level of the pipe transistor operation voltage PCG as the selected page becomes close to the drain select transistor, and may control the voltage generator 150 to lower the level of the pipe transistor operation voltage PCG as the selected page becomes close to the source select transistor. For example, the control logic 140 may control the voltage generator 150 such that the pipe transistor operation voltage PCG is increased by a step voltage ΔV according to a page address as the selected page comes close to the drain select transistor DST.

In another embodiment, the control logic 140 may control the voltage generator 150 to set the pipe transistor operation voltage PCG to the first potential level when memory cells included in the selected page are included in the drain-side memory cells, and may control the voltage generator 150 to set the pipe transistor operation voltage PCG to the second potential level lower than the first potential level when the memory cells included in the selected page are included in the source-side memory cells.

At step S130, the voltage generator 150 generates the pipe transistor operation voltage PCG under control of the control logic 140, and the address decoder 120 applies the pipe transistor operation voltage PCG to the pipe gate line of the memory cell array 110.

At step S140, the voltage generator 150 generates a program voltage Vpgm and a pass voltage Vpass under control of the control logic 140, and the address decoder 120 applies the program voltage Vpgm and the pass voltage Vpass respectively to the selected word line Sel WL and unselected word lines UNSel WL among the plurality of word lines.

At this time, the channel potential level of a string coupled to the bit line having the program prohibition voltage applied thereto is boosted by the pass voltage Vpass applied to the unselected word lines UNSel WL. The string coupled to the bit line having the program prohibition voltage applied thereto may be defined as a string in a program prohibition mode.

When a memory cell of the selected page is a memory cell for example, MC0 adjacent to the source select transistor SST when the program operation is performed according to the normal program scheme, the other memory cells MC1 to MCn are erase cells on which the program operation is not performed. Therefore, a channel boosting level may be relatively high due to a difference in potential level between threshold voltages of the erase cells and the pass voltage Vpass. When the channel boosting level is high, a program disturbance phenomenon may occur due to a band to band tunneling (BTBT) phenomenon. To prevent this, when the pipe transistor operation voltage PCG having a relatively low level is applied, a charge sharing region is decreased, and thus the channel boosting level can be decreased. When the memory cell of the selected page is a memory cell for example, MCn adjacent to the drain select transistor DST, the other memory cells MC0 to MCn−1 are memory cells on which the program operation is performed. Therefore, the channel boosting level may be relatively low as a difference in potential level between threshold voltages of the programmed memory cells and the pass voltage Vpass is relatively decreased. When the channel boosting level is low, the threshold voltage of the memory cell coupled to the selected word line Sel WL may be increased even in the program prohibition mode. To prevent this, when the pipe transistor operation voltage PCG having a relatively high level is applied, the charge sharing region is increased, and thus the channel boosting level can be increased.

Reverse Program Scheme

When a command CMD for a program command is input from the outside at step S110, the control logic 140 controls the peripheral circuit 16 to perform the program operation to the semiconductor memory device at steps S120 to S140. At this time, the control logic 140 controls the peripheral circuit 160 to sequentially program pages from the last page, in which memory cells adjacent to the drain select transistor are included, to the first page, in which memory cells adjacent to the source select transistor are included, according to the reverse program scheme.

The read/write circuit 130 arbitrarily stores data DATA to be programmed, which is input from the outside.

The plurality of page buffers PB1 to PBm control the potential levels of the bit lines BL1 to BLm according to the temporarily stored data, respectively. That is, the plurality of page buffers PB1 to PBm apply a program permission voltage for example, 0 V or a program prohibition voltage for example, Vcc to the bit lines BL1 to BLm according to the temporarily stored data, respectively.

At step S120, the control logic 140 sets the potential level of the pipe transistor operation voltage PCG according to the address ADDR of a selected page among a plurality of pages included in a selected memory block.

In this case, the control logic 140 may control the voltage generator 150 to lower a level of the pipe transistor operation voltage PCG as the selected page becomes close to the drain select transistor, and may control the voltage generator 150 to raise the level of the pipe transistor operation voltage PCG as the selected page becomes close to the source select transistor. For example, the control logic 140 may control the voltage generator 150 such that the pipe transistor operation voltage PCG is increased by a step voltage ΔV according to a page address as the selected page comes close to the source select transistor SST.

In another embodiment, the control logic 140 may control the voltage generator 150 to set the pipe transistor operation voltage PCG to the first potential level when memory cells included in the selected page are included in the source-side memory cells, and may control the voltage generator 150 to set the pipe transistor operation voltage PCG to the second potential level lower than the first potential level when the memory cells included in the selected page are included in the drain-side memory cells.

At step S130, the voltage generator 150 generates the pipe transistor operation voltage PCG under control of the control logic 140, and the address decoder 120 applies the pipe transistor operation voltage PCG to the pipe gate line of the memory cell array 110.

At step S140, the voltage generator 150 generates a program voltage Vpgm and a pass voltage Vpass under control of the control logic 140, and the address decoder 120 applies the program voltage Vpgm and the pass voltage Vpass respectively to the selected word line Sel WL and unselected word lines UNSel WL among the plurality of word lines.

At this time, the channel potential level of a string coupled to the bit line having the program prohibition voltage applied thereto is boosted by the pass voltage Vpass applied to the unselected word lines UNSel WL. The string coupled to the bit line having the program prohibition voltage applied thereto may be defined as a string in a program prohibition mode.

When a memory cell of the selected page is a memory cell for example, MCn adjacent to the drain select transistor DST when the program operation is performed according to the reverse program scheme, the other memory cells MC0 to MCn−1 are erase cells on which the program operation is not performed. Therefore, the channel boosting level may be relatively high due to a difference in potential level between threshold voltages of the erase cells and the pass voltage Vpass. When the channel boosting level is high, the program disturbance phenomenon may occur due to the BTBT phenomenon. To prevent this, when the pipe transistor operation voltage PCG having a relatively low level is applied, the charge sharing region is decreased, and thus the boosting level of the channel can be decreased. When the memory cell of the selected page is a memory cell for example, MC0 adjacent to the source select transistor SST, the other memory cells MC1 to MCn are memory cells on which the program operation is performed. Therefore, the channel boosting level may be relatively low as a difference in potential level between threshold voltages of the programmed memory cells and the pass voltage Vpass is relatively decreased. When the channel boosting level is low, the threshold voltage of the memory cell coupled to the selected word line Sel WL may be increased even in the program prohibition mode. To prevent this, when the pipe transistor operation voltage PCG having a relatively high level is applied, the charge sharing region is increased, and thus the channel boosting level can be increased.

Figure 6:
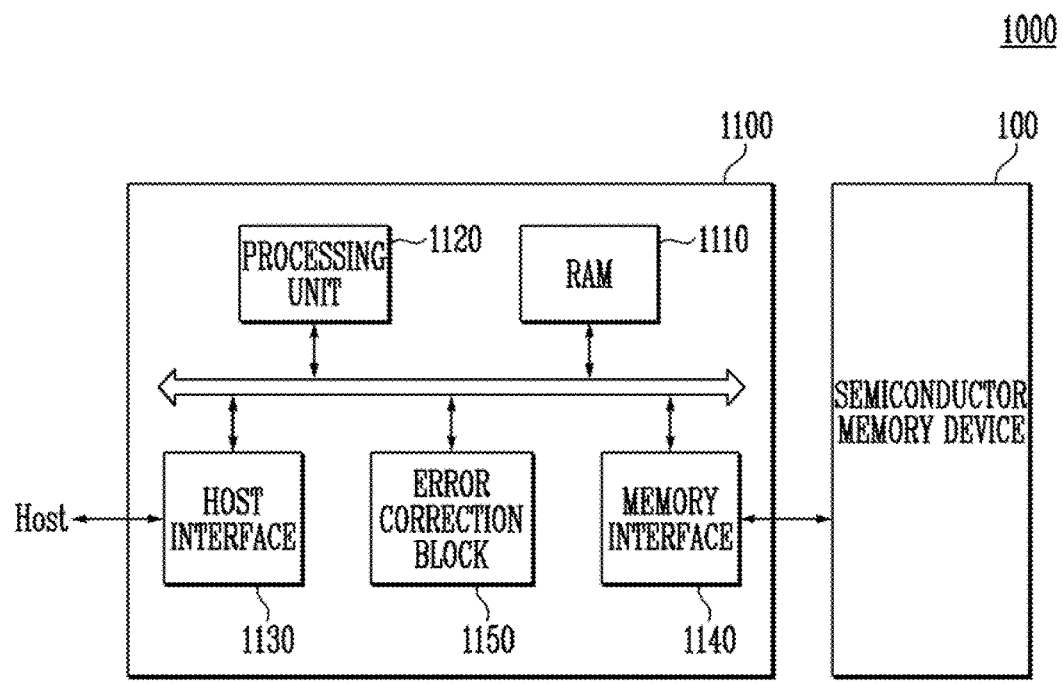
FIG. 6 is a block diagram illustrating a memory system including the semiconductor memory device of FIG. 1.

FIG. 6 is a block diagram illustrating a memory system including the semiconductor memory device of FIG. 1.

Referring to FIG. 6, the memory system 1000 includes a semiconductor memory device 100 and a controller 1100.

The semiconductor memory device 100 may be configured and operated identically to that described with reference to FIG. 1. Hereinafter, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the general operations of the controller 1100. Also, the controller 1100 may arbitrarily store program data provided from the host Host in a write operation.

The host interface 1130 includes a protocol for exchanging data between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an exemplary embodiment, the error correction block 1150 may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

In another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 7:
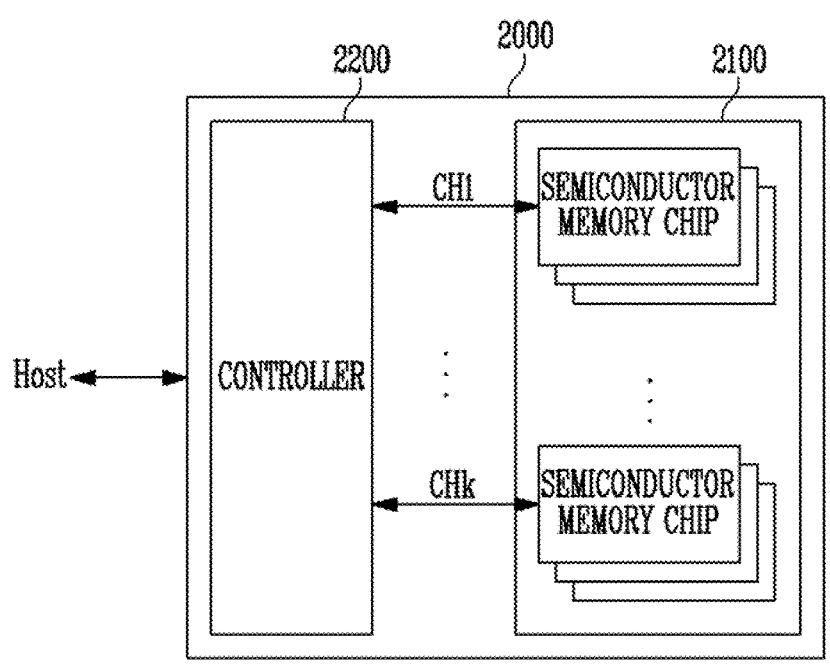
FIG. 7 is a block diagram illustrating an application example of the memory system of FIG. 6.

FIG. 7 is a block diagram illustrating an application example of the memory system of FIG. 6.

Referring to FIG. 7, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 7, it is illustrated that the plurality of groups communicate with the controller 2200 through first to kth channels CH1 to CHk. Each semiconductor memory chip may be configured and operated like the semiconductor memory device 100 described with reference to FIG. 1.

Each group is configured to communicate with the controller 2200 through one common channel. The controller 2200 is configured similarly to the controller 1100 described with reference to FIG. 10. The controller 2200 is configured to control the plurality of memory chips of the semiconductor memory device 2100 through the plurality of channels CH1 to CHk.

Figure 8:
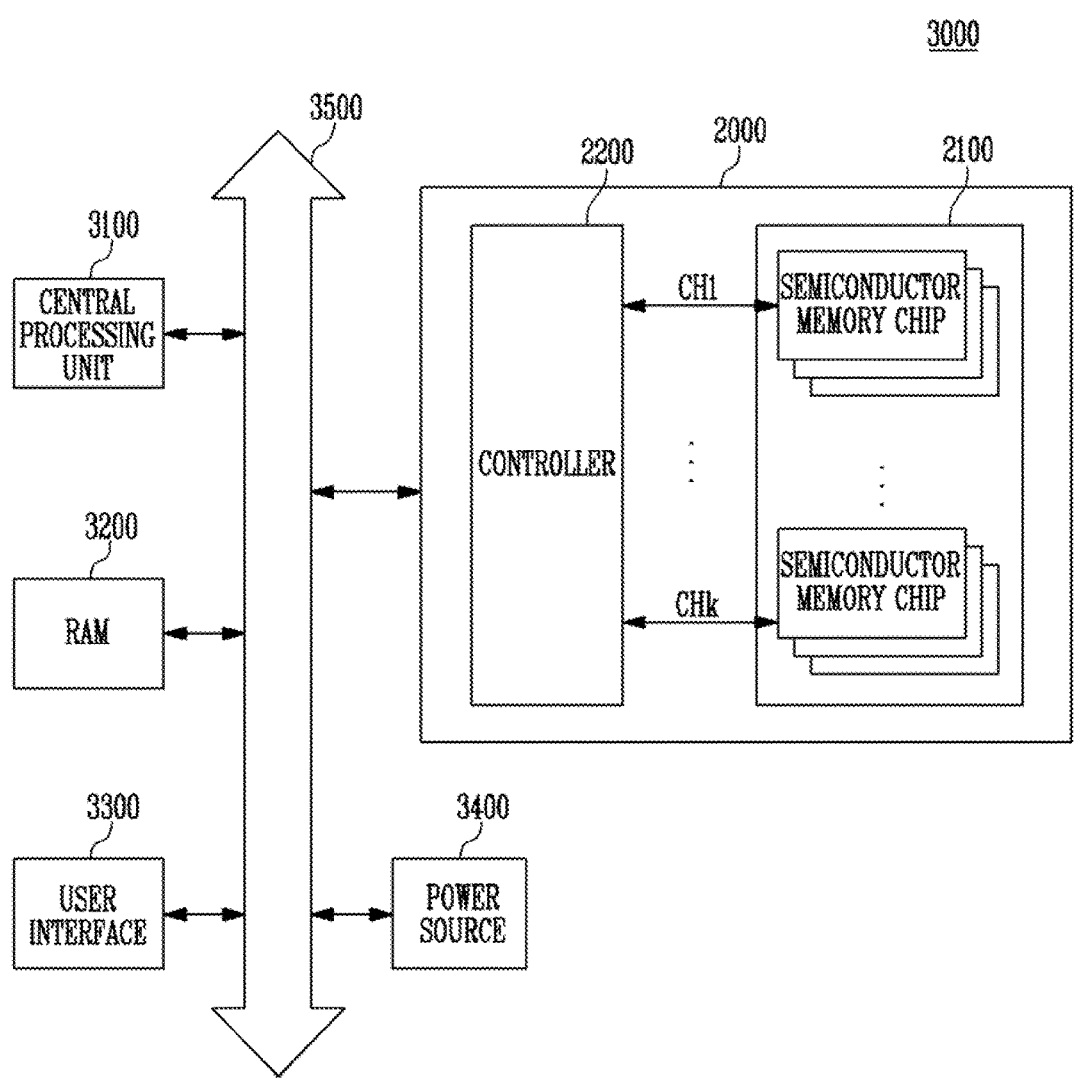
FIG. 8 is a block diagram illustrating a computing system including the memory system described with reference to FIG. 7.

FIG. 8 is a block diagram illustrating a computing system including the memory system described with reference to FIG. 7.

Referring to FIG. 8, the computing system 300 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 8, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 8, it is illustrated that the memory system 2000 described with reference to FIG. 7 is provided. However, the memory system 2000 may be replaced by the memory system 1000 described with reference to FIG. 6. In an exemplary embodiment, the computing system 3000 may be configured to include both the memory systems 1000 and 2000 described with reference to FIGS. 6 and 7.

According to the present disclosure, a channel boosting level is adjusted in a program operation of the semiconductor memory device, thereby preventing a program disturbance phenomenon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of pages;
   a peripheral circuit suitable for performing a program operation by applying a program voltage, a pass voltage, and a connection control transistor operation voltage, to the memory cell array; and
   a control logic suitable for controlling the peripheral circuit to perform the program operation,
   wherein the control logic adjusts a potential level of the connection control transistor operation voltage,
   wherein the memory cell array includes a plurality of strings, and
   wherein each of the plurality of strings comprises:
      a plurality of memory cells vertically stacked along a U-shaped channel layer, the plurality of memory cells comprising drain-side memory cells and source-side memory cells;
      a drain select transistor and a source select transistor provided on both ends of the U-shaped channel layer, respectively; and
      a connection control transistor arranged at a lowermost portion of the U-shaped channel layer and controlled by the connection control transistor operation voltage, wherein the connection control transistor couples the drain-side memory cells and the source-side memory cells while the connection control transistor operation voltage is adjusted according to an address of a selected page among the plurality of pages while a level of the pass voltage is not adjusted according to the address of the selected page among the plurality of pages.

2. The semiconductor memory device of claim 1, wherein memory cells coupled to the same word line among the plurality of memory cells included in the memory cell array are included in one page among the plurality of pages.

3. The semiconductor memory device of claim 2, wherein channel boosting levels of strings in a program prohibition mode among the plurality of strings are adjusted according to the connection control transistor operation voltage.

4. The semiconductor memory device of claim 1,
   wherein a string among the strings including the drain-side memory cells is coupled between a bit line and the connection control transistor, and a string among the strings including the source-side memory cells is coupled between a source line and the connection control transistor.

5. The semiconductor memory device of claim 1, wherein the connection control transistor operation voltage is applied to the connection control transistor.

6. The semiconductor memory device of claim 4, wherein the control logic controls the peripheral circuit such that memory cells are sequentially programmed from memory cells adjacent to the source select transistor to memory cells adjacent to the drain select transistor.

7. The semiconductor memory device of claim 1, wherein the control logic controls the potential level of the connection control transistor operation voltage to increase as the selected page becomes close to the drain select transistor.

8. The semiconductor memory device of claim 6, wherein the control logic:
controls the peripheral circuit to set the connection control transistor operation voltage to a first potential level when memory cells of the selected page included in the drain-side memory cells; and
controls the peripheral circuit to set the connection control transistor operation voltage to a second potential level lower than the first potential level when the memory cells of the selected page are included in the source-side memory cells.

9. The semiconductor memory device of claim 4, wherein the control logic controls the peripheral circuit such that memory cells are sequentially programmed from memory cells adjacent to the drain select transistor to memory cells adjacent to the source select transistor.

10. The semiconductor memory device of claim 9, wherein the control logic controls the potential level of the connection control transistor operation voltage to decrease as the selected page becomes close to the drain select transistor.

11. The semiconductor memory device of claim 9, wherein the control logic:
controls the peripheral circuit to set the connection control transistor operation voltage to a first potential level when memory cells of the selected page included in the drain-side memory cells; and
controls the peripheral circuit to set the connection control transistor operation voltage to a second potential level higher than the first potential level when the memory cells of the selected page are included in the source-side memory cells.

12. A semiconductor memory device comprising:
a plurality of strings including a plurality of memory cells coupled in series between a bit line and a source line;
a peripheral circuit suitable for performing a program operation by applying to the plurality of strings a program voltage, a pass voltage, and a connection control transistor operation voltage; and
a control logic suitable for controlling the peripheral circuit to perform the program operation,
wherein the control logic adjusts a potential level of the connection control transistor operation voltage, and
wherein each of the plurality of strings comprises:
the plurality of memory cells vertically stacked along a U-shaped channel layer, the plurality of memory cells comprising drain-side memory cells and source-side memory cells;
a drain select transistor and a source select transistor provided on both ends of the U-shaped channel layer, respectively; and
a connection control transistor arranged at a lowermost portion of the U-shaped channel layer and controlled by the connection control transistor operation voltage, wherein the connection control transistor couples the drain-side memory cells and the source-side memory cells, and the connection control transistor operation voltage is adjusted according to a program order of a selected memory cell among the plurality of memory cells while a level of the pass voltage is not adjusted according to the program order of the selected memory cell among the plurality of memory cells.

13. The semiconductor memory device of claim 12, wherein the control logic:
controls the peripheral circuit to sequentially program the plurality of memory cells according to the program order; and
controls the peripheral circuit so that the connection control transistor operation voltage is adjusted according to the program order of the selected memory cell.

14. The semiconductor memory device of claim 12, wherein channel potential levels of strings in a program prohibition mode among the plurality of strings are adjusted according to the potential level of the connection control transistor operation voltage.

15. The semiconductor memory device of claim 12, wherein a string among the strings including the drain-side memory cells is coupled between the bit line and the connection control transistor, and a string among the strings including the source-side memory cells is coupled between the source line and the connection control transistor.

16. A method of operating a semiconductor memory device comprising a plurality of strings including a plurality of drain-side memory cells and a plurality of source-side memory cells vertically stacked along a U-shaped channel layer, a drain select transistor and a source select transistor provided on both ends of the U-shaped channel layer, respectively, and a connection control transistor provided at a lowermost portion of the U-shaped channel layer to couple the drain-side memory cells and the source-side memory cells, the method comprising:
setting a potential level of a connection control transistor operation voltage according to positions of selected memory cells, to which a program voltage is applied among the plurality of drain-side memory cells and the plurality of source-side memory cells;
applying the set connection control transistor operation voltage to the connection control transistor; and
performing a program operation to the selected memory cells by applying the program voltage to the selected memory cells and applying a pass voltage to the other memory cells,
wherein a level of the pass voltage is not adjusted according to the positions of the selected memory cells.

17. The method of claim 16, wherein the setting of the potential level, the applying of the set connection control transistor operation voltage, and the performing of the program operation are sequentially repeated to memory cells adjacent to the selected memory cells in the direction of a bit line.

18. The method of claim 17, wherein the setting of the potential level of the connection control transistor operation voltage includes setting the connection control transistor operation voltage such that the potential level of the connection control transistor operation voltage is increased as the selected memory cells become close to the bit line.

19. The method of claim 16, wherein the setting of the potential level, the applying of the set connection control transistor operation voltage, and the performing of the program operation are sequentially repeated to memory cells adjacent to the selected memory cells in the direction of a source line.

20. The method of claim 19, wherein the setting of the potential level of the connection control transistor operation voltage includes setting the connection control transistor operation voltage such that the potential level of the connection control transistor operation voltage is increased as the selected memory cells become close to the source line.

* * * * *